United States Patent
Chen et al.

(10) Patent No.: US 11,747,389 B2
(45) Date of Patent: Sep. 5, 2023

(54) DEVICE AND METHOD FOR MEASURING HIGH ELECTRON MOBILITY TRANSISTOR

(71) Applicant: INNOSCIENCE (ZHUHAI) TECHNOLOGY CO., LTD., Zhuhai (CN)

(72) Inventors: Yulin Chen, Zhuhai (CN); Chunhua Zhou, Zhuhai (CN); Sichao Li, Zhuhai (CN); Wenjie Lin, Zhuhai (CN); Tao Zhang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 472 days.

(21) Appl. No.: 16/798,448

(22) Filed: Feb. 24, 2020

(65) Prior Publication Data
US 2021/0132137 A1    May 6, 2021

(30) Foreign Application Priority Data
Oct. 30, 2019  (CN) .......................... 201911045298.7

(51) Int. Cl.
*G01R 31/26* (2020.01)
*H01L 29/20* (2006.01)
(Continued)

(52) U.S. Cl.
CPC ...... *G01R 31/2621* (2013.01); *H01L 27/0255* (2013.01); *H01L 27/0288* (2013.01); *H01L 29/2003* (2013.01); *H01L 29/7786* (2013.01)

(58) Field of Classification Search
CPC ........... G01R 31/2621; H01L 27/0255; H01L 27/027; H01L 27/0288; H01L 29/2003;
(Continued)

(56) References Cited

U.S. PATENT DOCUMENTS

2006/0054927 A1*  3/2006  Wang ................... H01L 29/812
                                                          257/194
2016/0049786 A1*  2/2016  Kinzer .................. H02H 9/045
                                                          361/91.2
(Continued)

FOREIGN PATENT DOCUMENTS

CN        104604134 A       5/2015
CN        107464843 A       12/2017
(Continued)

OTHER PUBLICATIONS

First Office Action of the corresponding China patent application No. 201911045298.7 dated May 28, 2021.
(Continued)

*Primary Examiner* — Son T Le
*Assistant Examiner* — Adam S Clarke
(74) *Attorney, Agent, or Firm* — McCoy Russell LLP

(57) ABSTRACT

The application relates to a device and method for measuring a high electron mobility transistor. The device provided includes a controller, a protection circuit, a load circuit and a switching circuit electrically connected between the load circuit and the protection circuit. The controller is configured to provide a first control signal having a first value to a semiconductor component at a first time point and provide a second control signal having a second value to the switching circuit at a second time point. The semiconductor component is turned on by the first value of the first control signal, and the switching circuit is turned on by the second value of the second control signal. The second time point is later than the first time point.

3 Claims, 8 Drawing Sheets

(51) Int. Cl.
*H01L 27/02* (2006.01)
*H01L 29/778* (2006.01)

(58) Field of Classification Search
CPC ............ H01L 29/402; H01L 29/42376; H01L 29/518; H01L 29/7786
See application file for complete search history.

(56) References Cited

U.S. PATENT DOCUMENTS

| 2017/0104469 | A1* | 4/2017 | Mavretic | H03H 7/40 |
| 2017/0250685 | A1* | 8/2017 | Bina | H01L 29/7606 |
| 2018/0159529 | A1* | 6/2018 | Reusch | H01L 29/2003 |
| 2020/0244232 | A1* | 7/2020 | Cope | H03F 1/0272 |

FOREIGN PATENT DOCUMENTS

| CN | 108710076 A | 10/2018 |
| CN | 108732480 A | 11/2018 |
| CN | 108738350 A | 11/2018 |
| EP | 1608053 A1 | 12/2005 |
| JP | 2011187946 A | 9/2011 |
| JP | 2014192352 A | 10/2014 |

OTHER PUBLICATIONS

Zhou Qi et al., "GaN-on-Si Power Semiconductor Technology", Power Electronics, vol. 46, No. 12, Dec. 30, 2012.

\* cited by examiner

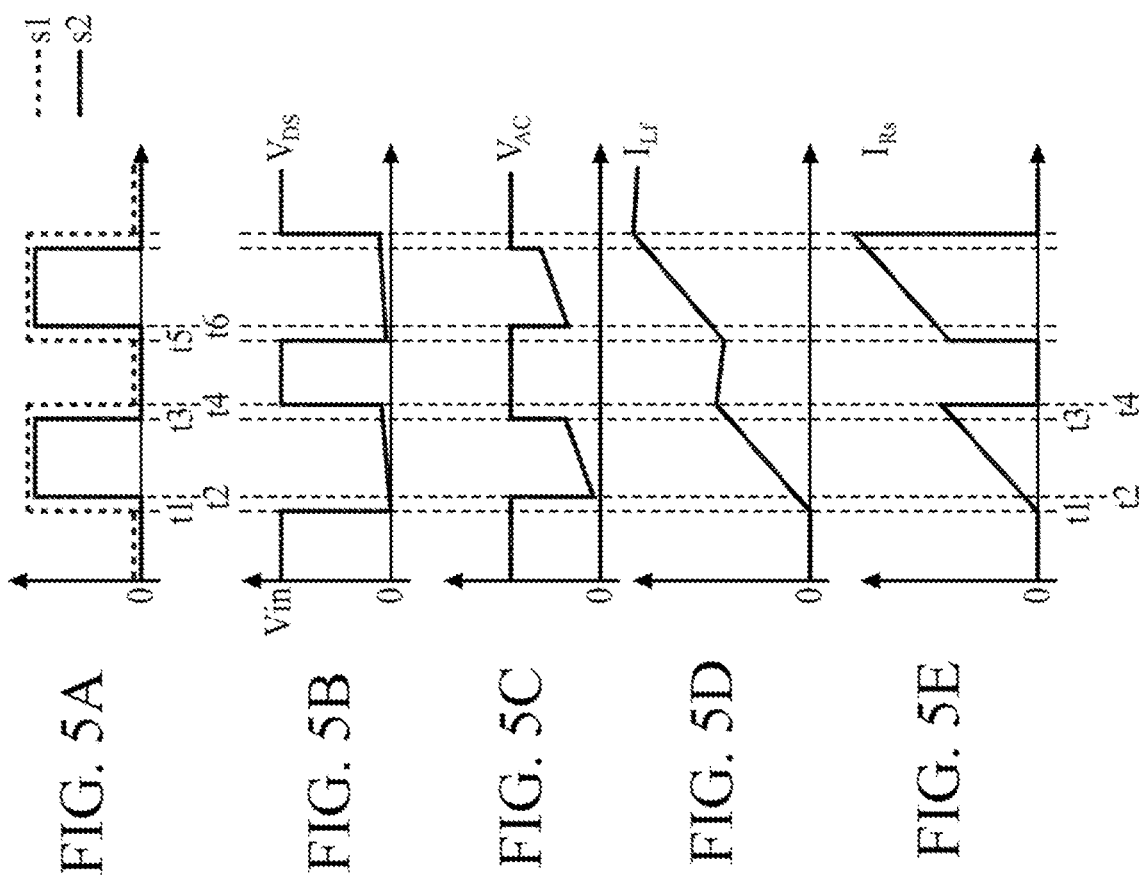

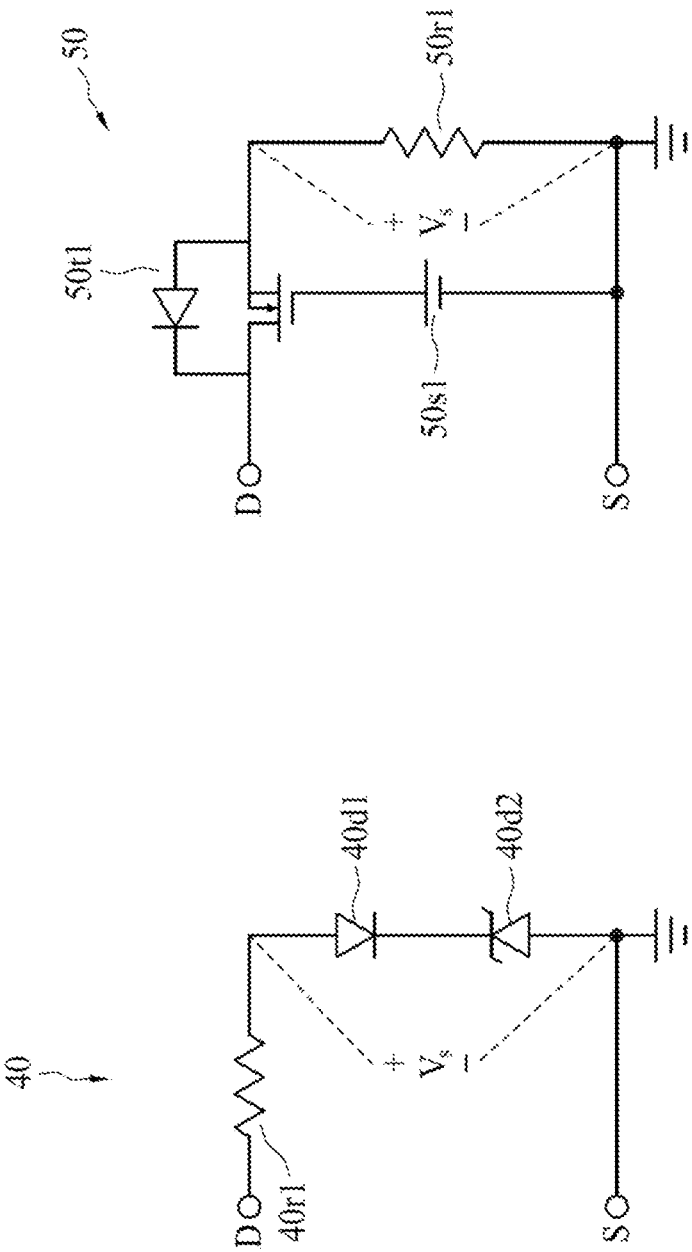

DEVICE AND METHOD FOR MEASURING HIGH ELECTRON MOBILITY TRANSISTOR

CROSS REFERENCE TO RELATED APPLICATIONS

The present application claims the benefit of priority from the China Patent Application No. 201911045298.7, filed on 30 Oct. 2019, the disclosure of which is hereby incorporated by reference in its entirety.

BACKGROUND OF THE INVENTION

1. Field of the Invention

The disclosure generally relates to a device and method for measuring a high electron mobility transistor, and more particularly to a device and method for measuring dynamic resistance.

2. Description of the Related Art

A high electron mobility transistor (HEMT) is one kind of field-effect transistors, and uses two or more materials having different bandgaps to form a heterojunction to provide a channel for a carrier, which is different from a metal-oxide-semiconductor field-effect transistor (MOSFET) that directly uses a doped semiconductor to form a conductive channel.

The high electron mobility transistor may include an III-V semiconductor which has some better electronic properties than silicon (Si), such as high saturation electron velocity and high electron mobility, so that the HEMT fabricated by the III-V semiconductor may be used, for example, in an environment with a frequency more than 250 GHz. If the III-V semiconductor and a Si component are both operated at a high frequency, the III-V semiconductor has less noise. Since the III-V semiconductor has a relatively high breakdown voltage, it is more suitable for being operated in a high-power occasion than the same Si component. An III-V semiconductor circuit may be used in mobile phones, satellite communications, microwave point-to-point connections, radar systems and other fields due to these properties.

Gallium nitride (GaN) is a compound of nitrogen and gallium, and is an III-V semiconductor of a direct bandgap.

The technology for fabricating the HEMT by the III-V semiconductor has been continuously developed in recent years. In the process of technology development, research and development personnel may improve the structure, material or manufacturing process of the III-V HEMT. If the performance parameters of the III-V HEMT may be accurately measured, the research and development personnel can accurately know whether changes in the structure or material of the III-V HEMT have produced good results to speed up the research and development. Conversely, if the performance parameters of the III-V HEMT may not be accurately measured, the research and development personnel will spend a lot of time and energy in repeated experimentation. At this time, the quality measurement of the III-V HEMT has become an important issue in the research and development process.

The measurement of the performance parameters is also very important in the mass production process of the III-V HEMT. The HEMT on each wafer needs to be sampled and detected during the mass production to ensure the performance. If the performance parameters of the III-V HEMT may not be accurately measured, the production efficiency will be substantially reduced.

An existing III-V HEMT measuring method has many defects, including poor accuracy, complex on-voltage compensation, a measurement error caused by reverse recovery of a diode used in measurement, slow measurement and other problems. For example, a current collapse causes an increase in dynamic on-resistance of a GaN power device, and the dynamic on-resistance is an important basis for evaluating the overall performance of the GaN device. There are two difficulties in directly measuring the dynamic on-resistance: first, the off-voltage Vds of the GaN power device is up to several hundred volts, but the on-voltage Vds is only several millivolts or less, so that the direct measurement of an on-voltage drop makes a channel of an oscilloscope saturated; and second, the accuracy is poor in the direct measurement.

Therefore, a measuring device and method capable of solving the above problems have been provided.

SUMMARY OF THE INVENTION

A device for measuring a high electron mobility transistor is provided. The device provided includes a controller, a protection circuit, a load circuit and a switching circuit electrically connected between the load circuit and the protection circuit. The controller is configured to provide a first control signal having a first value to a semiconductor component at a first time point and provide a second control signal having a second value to the switching circuit at a second time point. The semiconductor component is turned on by the first value of the first control signal, and the switching circuit is turned on by the second value of the second control signal. The second time point is later than the first time point.

A device for measuring a high electron mobility transistor is provided. The device provided includes a controller, a protection circuit, a load circuit and a switching circuit electrically connected between the load circuit and the protection circuit. The controller is configured to control the semiconductor component to be turned on between a first time point and a fourth time point and control the switching circuit to be turned on between a second time point and a third time point. The second time point is later than the first time point, and the fourth time point is later than the third time point.

A method for measuring a semiconductor component is provided. The method provided includes providing a first control signal having a first value at a first time point to turn on the semiconductor component. The method provided includes providing a second control signal having a second value at a second time point to turn on a switching circuit electrically connected to the semiconductor component. The method provided further includes providing the second signal having a third value at a third time point to turn off the switching circuit, and providing the first signal having a fourth value at a fourth time point to turn off the semiconductor component. The second time point is later than the first time point, and the fourth time point is later than the third time point.

BRIEF DESCRIPTION OF THE DRAWINGS

The aspects of the disclosure will become more comprehensible from the following detailed description made with reference to the accompanying drawings. It should be noted that, various features may not be drawn to scale, and the sizes of the various features may be increased or reduced arbitrarily for the purpose of clear description.

FIG. 5A, FIG. 5B, FIG. 5C, FIG. 5D and FIG. 5E are schematic illustrations of a measuring waveform according to some embodiments of the disclosure; and FIG. 6A, FIG. 6B, FIG. 6C and FIG. 6D are schematic illustrations of a measuring device according to some comparative embodiments of the disclosure.

The drawings and detailed descriptions use the same reference numerals to indicate same or similar elements. The disclosure will be more apparent from the detailed descriptions made with reference to the accompanying drawings.

PREFERRED EMBODIMENT OF THE INVENTION

Figure 1:
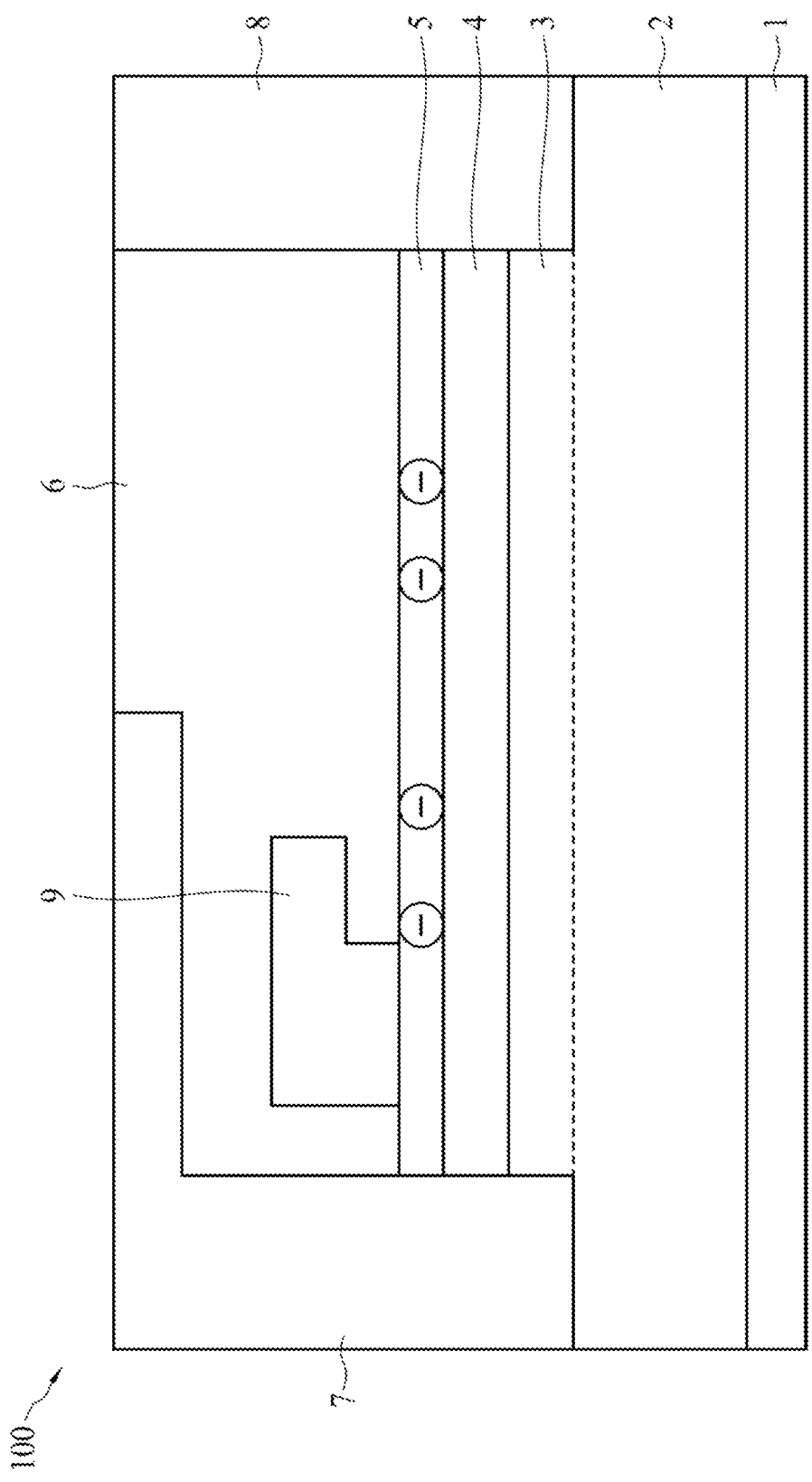
FIG. 1 is a schematic structural illustration of III-V HEMTs according to some embodiments of the disclosure.

The following disclosed content provides many different embodiments or examples of different features used to implement the provided subject matters. The following describes particular examples of components and deployments. Certainly, these are merely examples and are not intended to be limitative. In the disclosure, in the following descriptions, reference formed by the first feature above or on the second feature may include an embodiment formed by direct contact between the first feature and the second feature, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that, the disclosure provides many applicable concepts that can be implemented in various particular cases. The described particular embodiments are only illustrative and do not limit the scope of the disclosure.

FIG. 1 is a schematic structural illustration of an III-V HEMTs according to some embodiments of the disclosure.

In the embodiment shown in FIG. 1, the III-V HEMT may be a GaN HEMT. The GaN HEMT 100 may include a substrate 1, a buffer layer 2, a channel 3, a barrier layer 4, an insulating layer 5 and a passivation layer 6, and further includes a source 7, a drain 8 and a gate 9.

The substrate 1 may include silicon. The buffer layer 2 may include GaN and aluminum gallium nitride (AlGaN). The channel 3 having a high two-dimensional electron density is formed between the buffer layer 2 and the barrier layer 4. The barrier layer 4 may include AlGaN. The insulating layer 5 may include aluminum nitride (AlN).

The GaN HEMT may be used in a high frequency and/or high power environment. For example, when the GaN HEMT is applied to the high power environment, it has the advantage that a very low dynamic on-resistance (Rds-on) may be obtained after a high voltage off state is switched to a low voltage on state. However, when the GaN HEMT is used in a high frequency or radio frequency (RF) environment, the GaN HEMT often has a dynamic OFF/ON issue. The above dynamic OFF/ON issue is reflected in a value change of the Rds-on of the GaN HEMT. That is, the impedance value of the Rds-on still remains at a high level for a period of time after the GaN HEMT is switched between the OFF/ON states, and there is a time interval before the impedance value drops to an expected low level.

The above dynamic OFF/ON issue imposes limitations on the application of the GaN HEMT to systems requiring both high frequency and high power.

The reason of the formation of the value change of the Rds-on is described below with reference to FIG. 1.

When a high voltage is applied between the source 7 and the drain 8, electrons may be trapped by an energy trap at a junction of the barrier layer 4 and the insulating layer 5. When a voltage is applied to the gate 9 to turn on the GaN HEMT 100, the trapped electrons may not be dissipated immediately. The electrons trapped at the junction of the barrier layer 4 and the insulating layer 5 may repel electrons in the channel 3, resulting in a decrease in the quantity of the electrons in the channel 3, thereby increasing the Rds-on. Then, when the trapped electrons are dissipated, the Rds-on value of the GaN HEMT returns to the expected low level.

This phenomenon may affect the performance of the GaN HEMT 100, and especially when the GaN HEMT 100 is operated at a high frequency, the impact on the performance may be more significant.

In addition, an excessively high impedance value may cause the system to be overheated and fail. Therefore, the Rds-on value may be regarded as one of the quality standards of the GaN HEMT. Measurement of the Rds-on value of the GaN HEMT has also become an important issue. Since the Rds-on value is related to the energy trap at the junction of the barrier layer 4 and the insulating layer 5, the Rds-on value may be designed by appropriately modifying an epitaxy crystal growth program.

If the Rds-on value of the GaN HEMT may be accurately measured, the research and development personnel can accurately know whether the changes in the structure or material of the GaN HEMT produce good results and speed up the research and development.

Figure 2:
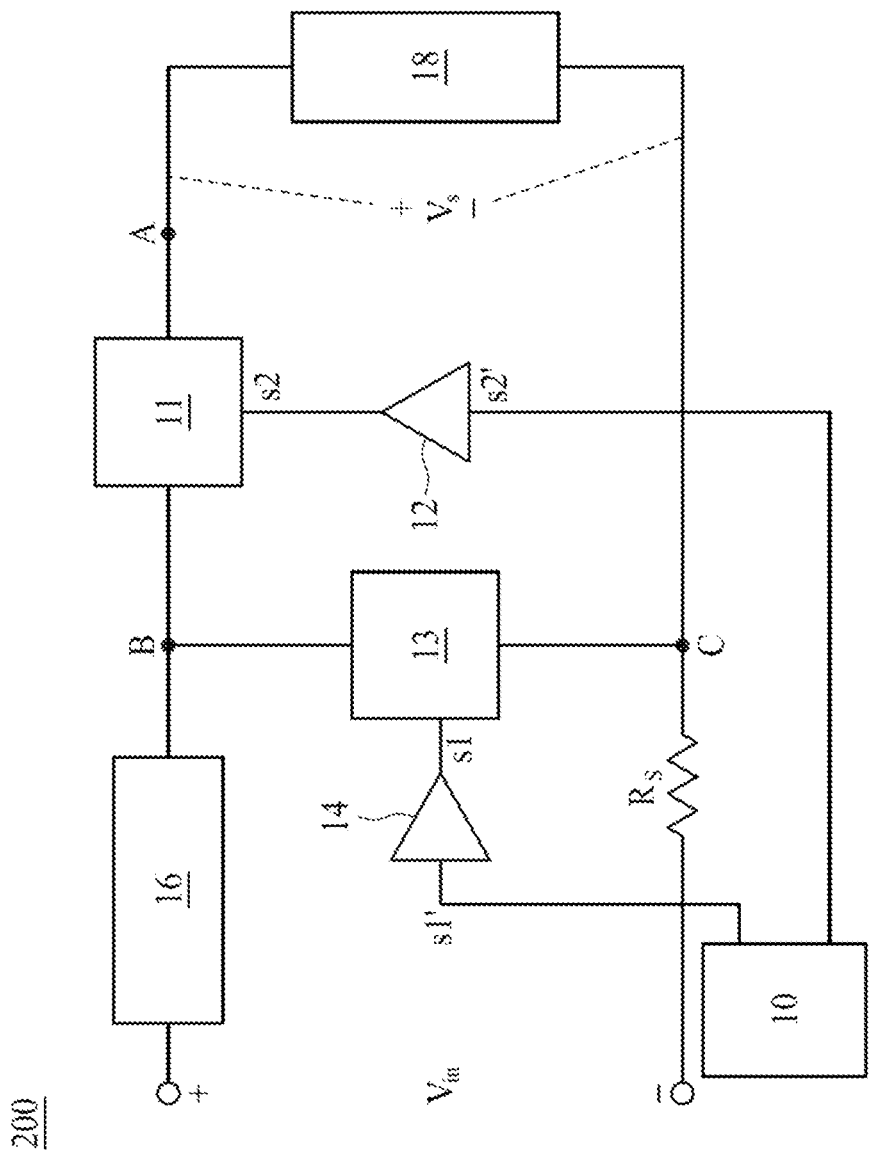
FIG. 2 is a schematic illustration of a measuring device according to some embodiments of the disclosure.

FIG. 2 is a schematic illustration of a measuring device according to some embodiments of the disclosure.

The measuring device 200 includes a controller 10, a switching circuit 11, a driving circuit 12, a driving circuit 14, a load circuit 16 and a protection circuit 18. One end of a to-be-tested device 13 is connected to the load circuit 16 (point B).

One end of the to-be-tested device 13 is connected to the switching circuit 11 (point B). One end of the to-be-tested device 13 is connected to the protection circuit 18 (point C).

The controller 10 may be a microprocessor, and may be a programmable integrated circuit, and may be a programmable logic circuit. In some embodiments, the operational logic in the controller 10 may not be changed after the controller 10 is manufactured. In some embodiments, the operational logic in the controller 10 may be programmatically changed after the controller 10 is manufactured. In some embodiments, the controller 10 may be a hardware component. In some embodiments, the function of the controller 10 may be implemented by software.

The switching circuit 11 may be a switch. In some embodiments, the switching circuit 11 may be an MOSFET. In some embodiments, the switching circuit 11 may be an n-type MOSFET. In some embodiments, the switching circuit 11 may be a p-type MOSFET. The switching circuit 11 is electrically connected between the point B and the point A. The switching circuit 11 is electrically connected between the to-be-tested device 13 and the protection circuit 18. The switching circuit 11 is electrically connected between one end of the to-be-tested device 13 and one end of the protection circuit 18. The switching circuit 11 is electrically connected between the load circuit 16 and the protection circuit 18. The switching circuit 11 is electrically connected between one end of the load circuit 16 and one end of the protection circuit 18.

The controller 10 may provide a control signal to the switching circuit 11. The controller 10 may provide a control signal to the to-be-tested device 13. In some embodiments, the controller 10 may directly provide a control signal to the switching circuit 11. In some embodiments, the controller 10 provides a control signal to the switching circuit 11 via the driving circuit 12. In some embodiments, the controller 10 may directly provide a control signal to the to-be-tested device 13. In some embodiments, the controller 10 provides a control signal to the to-be-tested device 13 via the driving circuit 14.

As shown in FIG. 2, the switching circuit 11 may be turned on/off by the control signal s2. The to-be-tested device 13 may be controlled by the control signal s1. A resistor Rs is used to test a current when the device 13 is turned on, and may be a resistor with high precision. In some embodiments, the resistor Rs may be connected between the point C and an input voltage Vin. In some embodiments, the resistor Rs may be connected in series with the to-be-tested device 13.

The driving circuit 12 may amplify the control signal provided by the controller 10. The driving circuit 12 may provide the amplified control signal to the switching circuit 11. An input signal s2' of the driving circuit 12 and an output signal s2 may have a proportional relationship. The driving circuit 14 may amplify the control signal provided by the controller 10. The driving circuit 14 may provide the amplified control signal to the to-be-tested device 13. An input signal s1' of the driving circuit 14 and an output signal s1 may have a proportional relationship.

In some embodiments, the proportional relationship between the input signal s2' and the output signal s2 is different from the proportional relationship between the input signal s1' and the output signal s1. In some embodiments, the proportional relationship between the input signal s2' and the output signal s2 is the same as the proportional relationship between the input signal s1' and the output signal s1.

One end of the load circuit 16 is connected to the to-be-tested device 13 (point B). One end of the load circuit 16 is connected to the input voltage Vin. The load circuit 16 may adjust a current flowing through the to-be-tested device 13. The load circuit 16 may adjust a voltage across the to-be-tested device 13. The load circuit 16 may stabilize the current flowing through the to-be-tested device 13. The load circuit 16 may prevent the to-be-tested device 13 from burning out during the test. The load circuit 16 may prevent the to-be-tested device 13 from overvoltage (or relatively high voltage) during the test.

One end of the protection circuit 18 is connected to the switching circuit 11 (point A). One end of the protection circuit 18 is connected to the input voltage Vin (point C). An external measuring device (not shown in the figure) may be connected to two ends of the protection circuit 18 to display measurement results. An external measuring device (not shown in the figure) may be connected to the points A and C to display the measurement results. In some embodiments, the external measuring device may be an oscilloscope. In some embodiments, the external measuring device may be a voltage measurer. In some embodiments, the external measuring device may be a current measurer. In some embodiments, the external measuring device may be an impedance measurer.

The protection circuit 18 may function as a fuse circuit. The protection circuit 18 may prevent damage to the external measuring device when the switching circuit 11 is damaged.

The input impedance of the protection circuit 18 is related to the impedance of the switching circuit 11. The input impedance of the protection circuit 18 has a specific relationship with the impedance of the switching circuit 11. The input impedance of the protection circuit 18 is much greater than the output impedance of the switching circuit 11 when the switching circuit 11 is turned on. The input impedance of the protection circuit 18 is much less than the output impedance of the switching circuit 11 when the switching circuit 11 is turned off. The input impedance of the protection circuit 18 is much greater than the output impedance of the switching circuit 11 when the switching circuit 11 is turned on, which ensures that a measured voltage $V_S$ is equal to an on-voltage Vds of the to-be-tested device 13 (i.e., Vs=Vds). The input impedance of the protection circuit 18 is much less than the impedance when the switching circuit 11 is turned off, which ensures that the $V_S$ is a low voltage when the to-be-tested device 13 and the switching circuit 11 are turned off, thereby ensuring high measurement accuracy. Therefore, when the device 13 is turned on, $V_S$ is equal to Vds, and when the device 13 is turned off, $V_S$ may also be ensured to be the low voltage. The on-voltage Vds of the to-be-tested device 13 is indirectly measured by measuring Vs, thereby avoiding the defect of low measurement accuracy caused by extremely high directly measured Vds when the to-be-tested device 13 is turned off.

By turning on/off the switching circuit 11, the controller 10 may control the signal transmission between the point B and the point A. By turning on/off the switching circuit 11, the controller 10 may control signals measured by the external measuring device. By turning on/off the switching circuit 11, the controller 10 may cause the external measuring device to measure signals expected by a user.

By controlling the turn-on time of the switching circuit 11 and the to-be-tested device 13, the controller 10 may cause the external measuring device to measure parameters, expected by the user, of the to-be-tested device 13. By controlling the turn-off time of the switching circuit 11 and the to-be-tested device 13, the controller 10 may cause the external measuring device to measure the parameters, expected by the user, of the to-be-tested device 13.

Since the measuring device 200 actively controls the turning on/off of the to-be-tested device 13 and the switching circuit 11 by the controller 10, the measuring device 200 may be referred to as an active measuring device.

Figure 3:
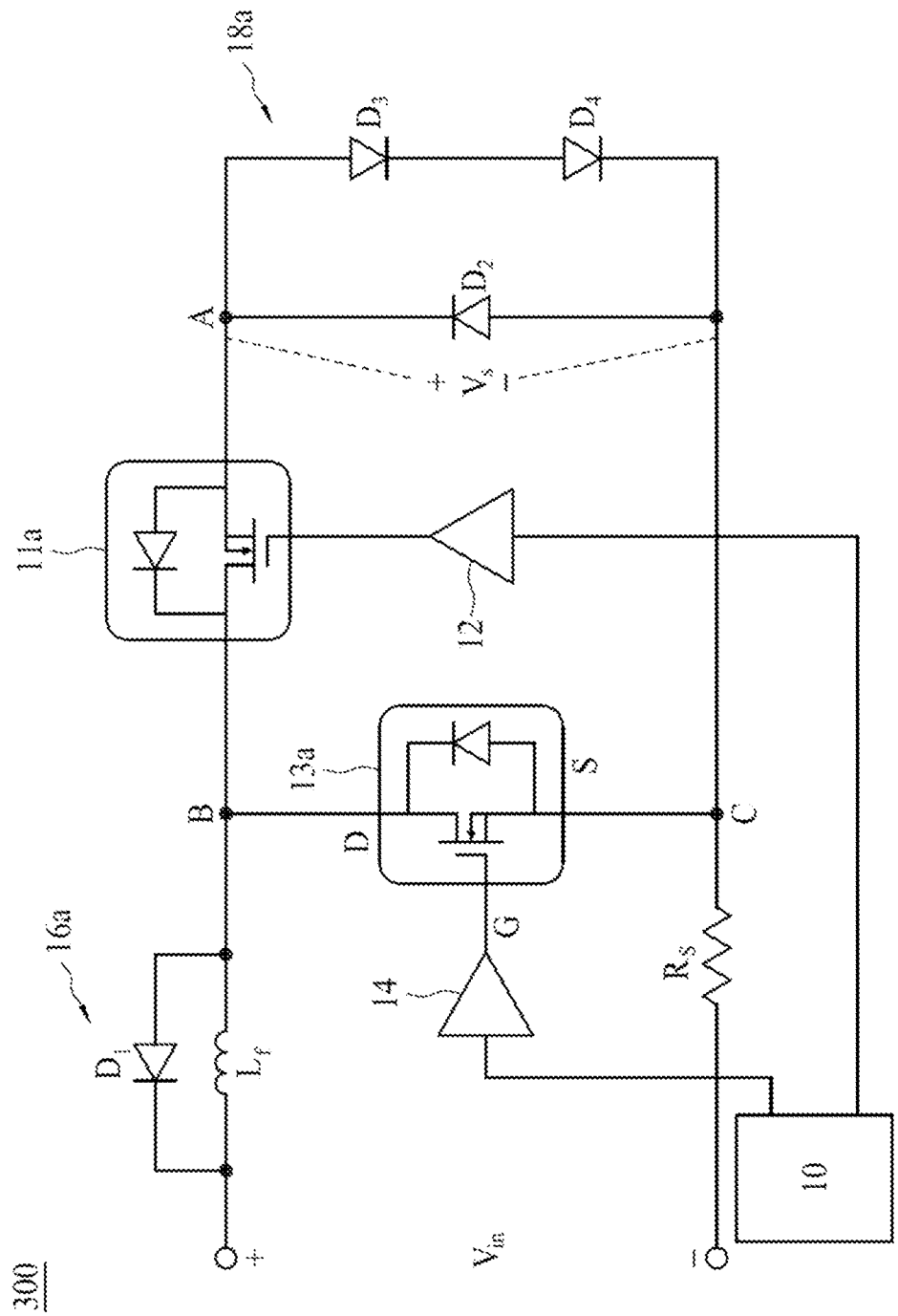
FIG. 3 is a schematic illustration of a measuring device according to some embodiments of the disclosure.

FIG. 3 is a schematic illustration of a measuring device according to some embodiments of the disclosure.

The measuring device 300 shown in FIG. 3 is similar to the measuring device 200 shown in FIG. 2. The measuring device 300 has a load circuit 16a and a protection circuit 18a. The load circuit 16a includes a diode D1 and an inductor Lf connected in parallel. In some embodiments, the inductor Lf may be replaced with a resistor.

The diode D1 may function as a clamping diode. The diode D1 may function as a freewheeling diode. When the to-be-tested device 13a is turned off, the diode D1 may prevent the voltage at the point B from exceeding the input voltage Vin.

The measuring device 300 is used to measure the to-be-tested device 13a. In some embodiments, the to-be-tested device 13a is a semiconductor device. In some embodiments, the to-be-tested device 13a is a semiconductor component. In some embodiments, the to-be-tested device 13a may be an III-V semiconductor device. In some embodiments, the to-be-tested device 13a may be a GaN HEMT. The gate G of the GaN HEMT is connected to an output of the driving circuit 14. The gate G of the GaN HEMT receives the control signal provided by the controller 10. The drain D of the GaN HEMT is connected to the point B. The source S of the GaN HEMT is connected to one end of the resistor Rs.

By turning on/off the switching circuit 11a, the controller 10 may control the signal transmission between the point B and the point A. In some embodiments, the switching circuit 11a may be an n-type MOSFET. In some embodiments, the switching circuit 11a may be a p-type MOSFET.

The protection circuit 18a has diodes D2, D3, and D4. The diodes D3 and D4 are connected in series with each other and in parallel with the diode D2. As shown in FIG. 3, the cathode of the diode D2 is connected to the anode of the diode D3, and the anode of the diode D2 is connected to the cathode of the diode D4.

The protection circuit 18a may function as a clamp network. When the switching circuit 11a is turned on/off, the protection circuit 18a may prevent a voltage at the point A from suddenly rising to a high voltage, and may also prevent the voltage at the point A from suddenly dropping to a low voltage. A sudden rise or drop of the voltage at the point A will affect the measurement accuracy. The sudden rise or drop of the voltage at the point A will increase the difficulty of measurement.

The operation of the measuring device 300 will now be described with reference to FIG. 3.

At the very beginning, the switching circuit 11a and the to-be-tested device 13a are both in an off state, and when the to-be-tested device 13a is turned on, the voltage at the point B drops to be near 0 volt. Then, the switching circuit 11a is turned on. After the switching circuit 11a is turned on, the voltage at the point A is equal to the voltage at the point B.

At the set turn-on time point, the switching device 11a is turned off, and then the to-be-tested device 13a is turned off. At this time, the voltage at the point B rises, and the voltage at the point A also rises, but is clamped to a lower voltage by D3 and D4. When the to-be-tested device 13a is turned off, the load circuit 16a causes the voltage at the point B not to exceed the input voltage Vin. The clamp network composed of D2, D3, and D4 may prevent the voltage at the point A from rising to a very high voltage or dropping to a very low negative voltage in short time when the switching circuit 11a is turned on/off. The sudden rise and drop of the voltage at the point A will affect the measurement accuracy.

When the switching circuit 11a is turned on, the voltage at the point A is equal to the voltage at the point B. There is no need to compensate for the on-voltage drop of the diode compared to using a conventional diode.

Compared to a passive measuring solution using an MOSFET (e.g., the comparative embodiments shown in FIGS. 6B and 6C), the measuring device 300 also has advantages. The voltage range of the point A is relatively large when the MOSFET is switched between a linear region (when the to-be-tested device 13a is turned off) and a saturation region (when the to-be-tested device 13a is turned on). For example, a transistor 50t1 and a transistor 60t1 shown in FIGS. 6B and 6C have a relatively large range of the measured voltage $V_S$ and low measurement accuracy when they are switched between the linear region (when the to-be-tested device 13a is turned off) and the saturation region (when the to-be-tested device 13a is turned on). In contrast, the measured voltage $V_S$ of the measuring device 300 shown in FIG. 3 is clamped in a low voltage range by the clamp network (composed of D2, D3, and D4), which ensures the measurement accuracy.

Since the measuring device 300 actively controls the turning on/off of the to-be-tested device 13a and the switching circuit 11a by the controller 10, the measuring device 300 may be also referred to as an active measuring device.

Figure 4:
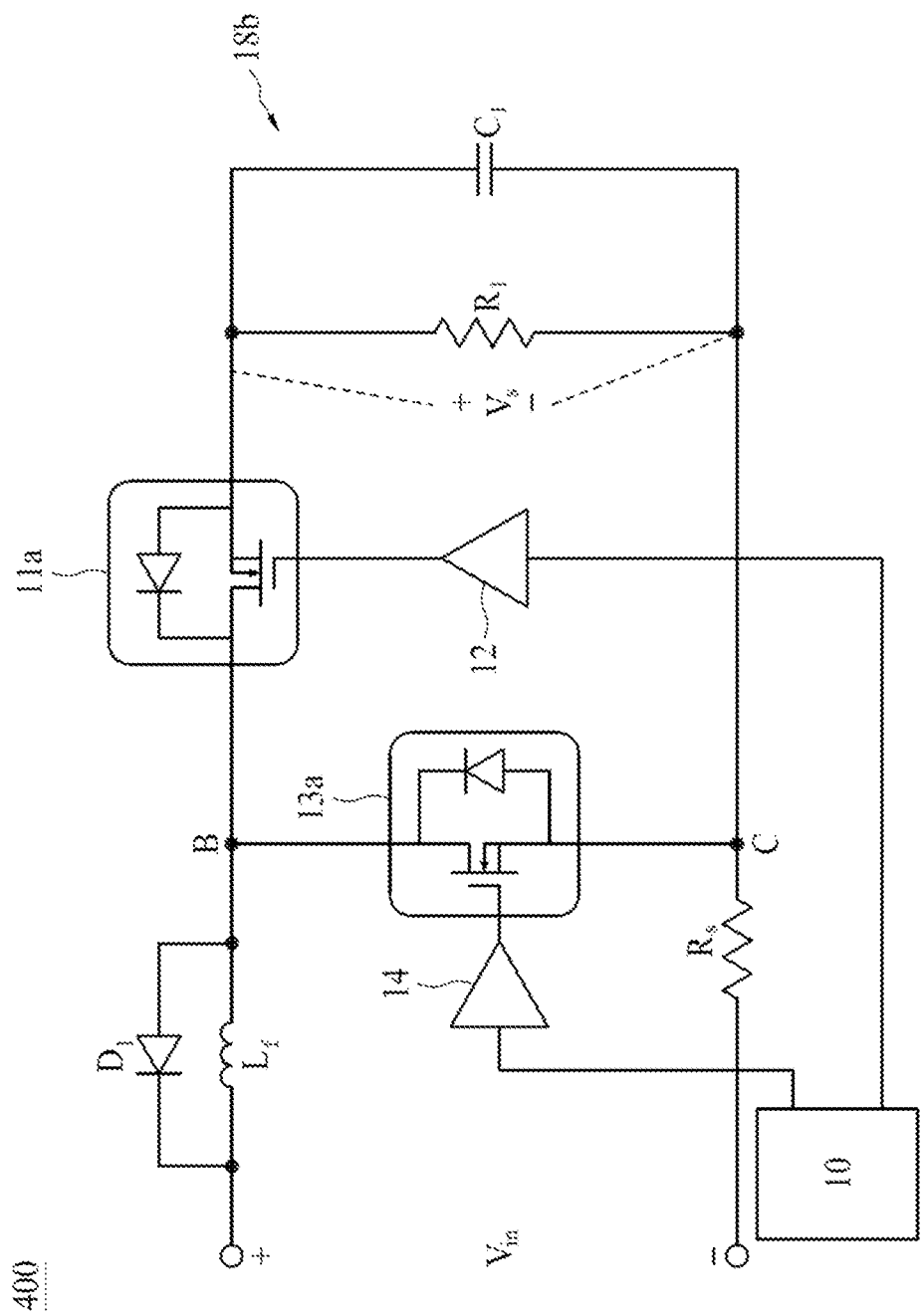
FIG. 4 is a schematic illustration of a measuring device according to some embodiments of the disclosure.

FIG. 4 is a schematic illustration of a measuring device according to some embodiments of the disclosure.

The measuring device 400 shown in FIG. 4 is similar to the measuring device 300 shown in FIG. 2.

The difference between the measuring device 400 and the measuring device 300 lies in the protection circuit 18 of the measuring device. The protection circuit 18b includes a resistor R1 and a capacitor C1. The resistor R1 is connected in parallel with the capacitor C1. The parallel-connected resistor R1 and capacitor C1 are connected between the point A and the point C. The impedance of the resistor R1 has a specific relationship with the impedance of the switching circuit 11a. In some embodiments, the impedance value of the resistor R1 is much greater than the output impedance of the switching circuit 11a when the switching circuit 11a is turned on. The capacitor C1 provides a filtering function. The capacitor C1 may avoid sudden changes in the voltage at the point A. The capacitor C1 maintains the voltage at the point A within a very small voltage range. The stability of the voltage at the point A may improve the measurement accuracy of the to-be-tested device 13. The stability of the voltage at the point A may reduce the difficulty in measuring the to-be-tested device 13.

Since the measuring device 400 actively controls the turning on/off of the to-be-tested device 13a and the switching circuit 11a by the controller 10, the measuring device 400 may be referred to as an active measuring device.

Referring to FIG. 3 and FIG. 4, the turn-on time of the to-be-tested device 13a is earlier than the turn-on time of the switching device 11a, but the turn-off time is later than the turn-off time of the switching device 11a (see FIG. 5A). Furthermore, the input impedance of the protection circuit 18a/18b is much greater than the output impedance of the switching device 11a when the switching device 11a is turned on, while the input impedance of the protection circuit 18a/18b is much less than the output impedance of the switching device 11a when the switching device 11a is turned off. Therefore, when the device 11a is turned on, Vs is equal to Vds; and when the device 11a is turned off, Vs may also be ensured to be a low voltage. The on-voltage Vds of the to-be-tested device 13a is indirectly measured by measuring the voltage Vs, thus avoiding the defects of low measurement accuracy and easy saturation of the channel of an oscilloscope due to an extremely high off-voltage when the on-voltage Vds of the to-be-tested device 13a is directly measured. This active test solution is also an indirect test solution. The on-voltage Vds of the device 13a is indirectly measured by measuring Vs, so as to fulfill the aim of measuring the dynamic on-resistance of the device 13a.

FIG. 5A, FIG. 5B, FIG. 5C, FIG. 5D and FIG. 5E are schematic illustrations of a measuring waveform according to some embodiments of the disclosure.

The measuring waveform shown in FIG. 5A may be obtained from the measuring device 200, the measuring device 300, or the measuring device 400.

Description is made below with reference to the measuring device 200. FIG. 5A shows waveforms of the control signals s1 and s2. The control signal s1 is used to control the to-be-tested device 13, and the control signal s2 is used to control the switching circuit 11. As shown in FIG. 5A, the control signal s1 rises to a high potential at a time point t1 to turn on the to-be-tested device 13. After t1, the control signal s2 rises to a high potential at a time point t2 to turn on the switching circuit 11. In some embodiments, the control signal s1 rises to a voltage value V1 at the time point t1, and the control signal s2 rises to a voltage value V2 at the time point t2. In some embodiments, the voltage value V1 and the voltage value V2 may be the same. In some embodiments, the voltage value V1 and the voltage value V2 may be different.

A difference value between the time point t1 and the time point t2 may be adjusted according to the to-be-tested device 13. In some embodiments, the difference value between time point t1 and time point t2 may range from 30 nanoseconds to 100 nanoseconds.

The control signal s2 drops to a low potential at a time point t3 to turn off the switching circuit 11. After t3, the control signal s1 drops to a low potential at a time point t4 to turn off the to-be-tested device 13. In some embodiments, the control signal s2 drops to a voltage value V3 at the time point t3, and the control signal s1 drops to a voltage value V4 at the time point t4. In some embodiments, the voltage value V3 and the voltage value V4 may be the same. In some embodiments, the voltage value V3 and the voltage value V4 may be different.

A difference value between the time point t3 and the time point t4 may be adjusted according to the to-be-tested device 13. In some embodiments, the difference value between time point t3 and time point t4 may range from 30 nanoseconds to 100 nanoseconds.

When the control signal s2 starts to turn on the switching circuit 11 between t2 and t3, an external measuring device may measure a voltage between the point A and the point C. Further, since the impedance of the switching circuit 11 is almost zero during turning on, a voltage between the A point and the B point is equal. Therefore, the voltage Vs may be measured to indirectly measure the voltage of the to-be-tested device 13 between the turn-on time t2 and the turn-on time t3.

FIG. 5B shows a waveform of a voltage at two ends (VDs) of the to-be-tested device 13. The measuring waveform shown in FIG. 5B may be obtained from the measuring device 200, the measuring device 300, or the measuring device 400.

Before the time point t1, the to-be-tested device 13 remains off, and the voltage at the two ends of the to-be-tested device 13 is similar to the input voltage Vin. The control signal s1 turns on the to-be-tested device 13 at the time point t1, and the voltage VDS at the two ends of the to-be-tested device 13 drops to a low potential due to the turning on of the to-be-tested device 13. When the to-be-tested device 13 remains on between t1 and t4, the voltage VDS at two ends of the to-be-tested device 13 remains the low potential.

The voltage VDS at the two ends of the to-be-tested device 13 between t1 and t2 drops from the high potential to the low potential. Due to a large difference in the voltages at the two ends of the to-be-tested device 13 at the time points t1 and t2, it is difficult to accurately measure the voltage. For example, the voltage VDS at the two ends of the to-be-tested device 13 may be as high as several hundred volts before the time point t1, and the voltage VDS at the two ends of the to-be-tested device 13 may drop to several ten millivolts or less after the time point t2. Therefore, measuring the to-be-tested device 13 between t1 and t2 will cause a problem of poor accuracy. For example, if the voltage VDS at the two ends of the to-be-tested device 13 at the time point t1 is measured with a low voltage position of the oscilloscope, the oscilloscope will be overloaded and fail in measurement. If the voltage VDS at the two ends of the to-be-tested device 13 at the time point t2 is measured with a high voltage position of the oscilloscope, the voltage VDS at the two ends of the to-be-tested device 13 is too small at the time point t2, so that an accurate value may not be obtained.

Similarly, the voltage at the two ends of the to-be-tested device 13 rises from the low potential to the high potential between t3 and t4. Because of the large difference in the voltages at the two ends of the to-be-tested device 13 at time points t3 and t4, it is difficult to accurately measure the voltage.

Therefore, the measuring device 200, the measuring device 300 or the measuring device 400 provided by the application limits the measuring time of the to-be-tested device 13 to be between t2 and t3. The measuring method provided by the application excludes the measurement between the time point t1 and the time point t2. The measuring method provided by the application excludes the measurement between the time point t3 and the time point t4.

An external measuring device measures the to-be-tested device 13 between t2 and t3. It can be seen from FIG. 5B that the voltage $V_{DS}$ at the two ends of the to-be-tested device 13 remains the low potential between t2 and t3, so that the external measuring device (for example, an oscilloscope) may be adjusted to a low position. The so-called low position represents that the external measuring device may accurately measure a small value range. The external measuring device may accurately measure the voltage $V_{DS}$ at the two ends of the to-be-tested device 13 between t2 and t3. In some embodiments, the accuracy of measuring the voltage of the to-be-tested device 13 between t2 and t3 may be improved by 5 times due to the selection of an appropriate position.

FIG. 5C shows a waveform of a voltage ($V_{AC}$) at two ends of the protection circuit 18. FIG. 5C shows a waveform of a voltage between the point A and the point C. The waveform shown in FIG. 5C is similar to the waveform shown in FIG. 5B. The voltage between the point A and the point C is a sum of the voltage at the two ends of the to-be-tested device 13 and the voltage at the two ends of the device 11a.

FIG. 5D shows a waveform of a current of the inductor Lf in the load circuit 16a. The magnitude of the current of the inductor Lf increases with time. The magnitude of a load may be seen from the waveform of the current of the inductor Lf.

FIG. 5E shows a waveform of a current $I_{Rs}$ flowing through the resistor Rs. The current $I_{RS}$ is the same as a current $I_D$ flowing through the two ends of the to-be-tested device 13.

The to-be-tested device 13 is turned on between t2 and t3. The accurate dynamic on-resistance Rds-on may be obtained by measuring the obtained accurate voltage $V_{AC}$ (at this time, $V_{AC}=V_{DS}$) and the accurate current $I_{RS}$ ($I_{RS}=I_D$) between t2 and t3.

The measuring method provided by the application controls the turn-on time and the turn-off time of the to-be-tested device 13 and the switching circuit 11, so that the to-be-tested device 13 is turned on before the switching circuit 11, and the switching circuit 11 is turned off before the to-be-tested device 13. The input impedance of the protection circuit 18 is much greater than the on-impedance of the switching circuit 11, but much less than the off-impedance of the switching circuit 11. In this way, when the to-be-tested device 13 is turned on, the voltage at a test point (the point A) is equal to the on-voltage of the to-be-tested device 13; and when the to-be-tested device 13 is turned off, the voltage at the test point (the point A) is limited to a very small range, which ensures the measurement accuracy.

FIG. 6A, FIG. 6B, FIG. 6C and FIG. 6D are schematic illustrations of a measuring device according to some comparative embodiments of the disclosure.

As shown in FIG. 6A, the measuring device 40 includes a resistor 40r1, a diode 40d1 and a diode 40d2. The resistor 40r1 is connected to the diode 40d1. The diode 40d1 is connected in series with the diode 40d2. In some embodiments, the diode 40d2 may be a Zener diode. In some embodiments, in order to avoid the problems of reverse recovery time and reverse recovery current, the diode 40d2 may be a Schottky diode. The to-be-tested device 13 may be connected between a terminal D and a terminal S of the measuring device 40.

In some embodiments, the to-be-tested device 13 may be a GaN HEMT. When the GaN HEMT is turned off, there is a high voltage between the terminal D and the terminal S, and the resistor 40r1 with a large resistance value and the diode 40d2 block the high voltage together. At this time, $V_S$ is equal to a clamping voltage of the diode 40d2. When the GaN HEMT is turned on, the voltage $V_S$ is equal to the voltage $V_{DS}$ at two ends of the GaN HEMT. The dynamic on-resistance Rds-on of the to-be-tested device 13 may be obtained by obtaining the voltage $V_S$ and the current $I_{Rs}$ when the to-be-tested device 13 is turned on.

The measuring device 40 does not actively switch the to-be-tested device 13 using a control signal, and may also be referred to as a passive measuring device. When the to-be-tested device 13 is a GaN HEMT, since the voltage $V_S$ is relatively high when the GaN HEMT is turned off, an external measuring device (for example, an oscilloscope) needs to be adjusted to a high position to measure the to-be-tested device 13. The external measuring device adjusted to the high position may not accurately measure a small voltage, so the use of the measuring device 40 will result in low measurement accuracy when the GaN HEMT is turned on. In addition, a relatively large RC constant of the measuring device 40 results in a long discharge time and slow reaction, which in turn requires relatively long measurement time.

In a manufacturing process of the HEMT, the HEMT on a wafer is detected. The HEMT on the wafer may be detected by a sampling mode sometimes. However, sometimes it is necessary to detect all the HEMTs on the wafers to determine the yield of the manufacturing process. The quantity of III-V HEMTs that may be included on an existing 12-inch or 18-inch wafer is about between 3000 and 7500 (estimated by the area of the HEMT components: 4.6 mm*4.6 mm) If the detection time of a single HEMT component on the wafer is increased by 1 min, the time for detecting the entire wafer will be increased by 50 h to 125 h. The time for the above detection will greatly reduce the production efficiency.

As shown in FIG. 6B, the measuring device 50 includes a resistor 50r1, an auxiliary power source 50s1 and a transistor 50t1. The to-be-tested device 13 may be connected between a terminal D and a terminal S of the measuring device 50. In some embodiments, the to-be-tested device 13 may be a GaN HEMT.

When the GaN HEMT is turned off, there is a high voltage between the terminal D and the terminal S, the transistor 50t1 is in a linear state, and the voltage $V_S$ is approximately equal to a voltage of the auxiliary power source 50s1. When the GaN HEMT is turned on, the transistor 50t1 is on, and the voltage $V_S$ is equal to the voltage $V_{DS}$ between the terminal D and the terminal S. The dynamic on-resistance Rds-on of the to-be-tested device 13 may be obtained by obtaining the voltage $V_S$ and the current $I_{RS}$ when the to-be-tested device 13 is turned on.

The measuring device 50 does not actively switch the to-be-tested device 13 using a control signal, and may also be referred to as a passive measuring device.

In FIG. 6B, when the transistor 50t1 is turned off, the voltage of the auxiliary power source 50s1 will be superimposed on a measured voltage, leading to low measurement sensitivity of a measuring probe and thus resulting in low precision. The voltage of the auxiliary power supply 50s1 may cause a decrease in the measurement accuracy when the GaN HEMT is turned on. The voltage of the auxiliary power supply 50s1 may reduce the measurement accuracy of a small Rds-on when the GaN HEMT is turned on. In addition, the transistor 50t1 is low in natural switching speed in the linear region (when the GaN HEMT is turned off) and the saturation region (when the GaN HEMT is turned on), which easily causes oscillation and affects a measurement result.

Figure 6C:
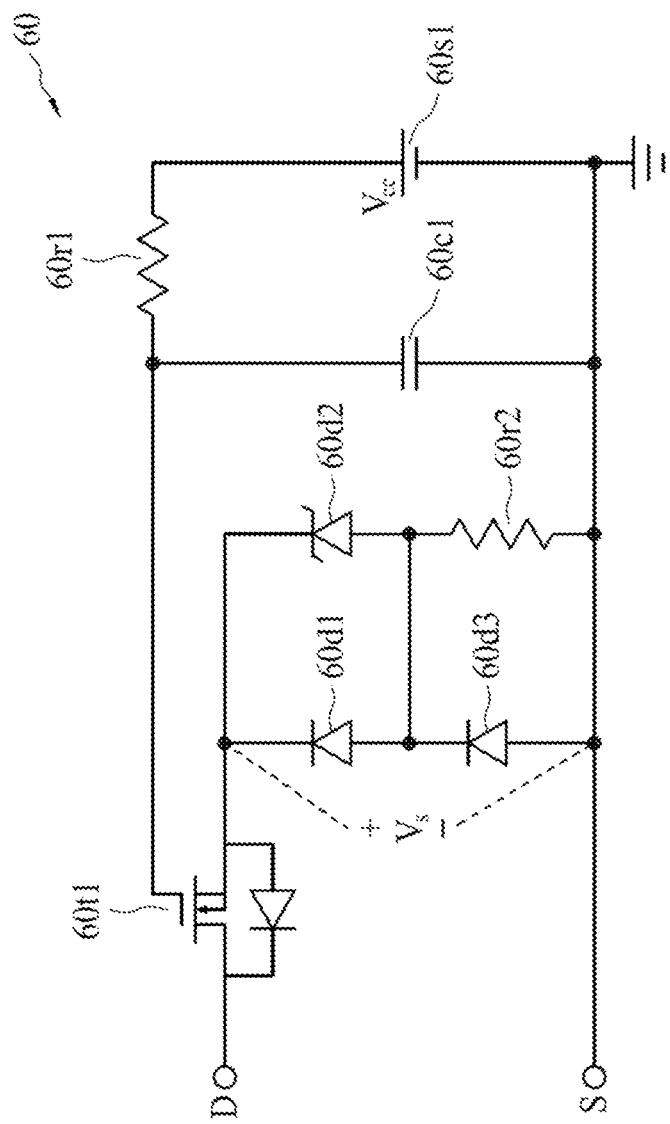

As shown in FIG. 6C, the measuring device 60 includes a resistor 60r1, a resistor 60r2, a capacitor 60c1, an auxiliary power source 60s1, diodes 60d1, 60d2 and 60d3 and a transistor 60t1. The to-be-tested device 13 may be connected between a terminal D and a terminal S of the measuring device 60. In some embodiments, the to-be-tested device 13 may be a GaN HEMT.

When the GaN HEMT is turned off, there is a high voltage between the terminal D and the terminal S, the transistor 60t1 is in a linear state, and the voltage $V_S$ is approximately equal to a voltage Vcc of the auxiliary power source 60s1. When the GaN HEMT is turned on, the transistor 60t1 is turned on, and the voltage $V_S$ is equal to the voltage $V_{DS}$ between the terminal D and the terminal S. The dynamic on-resistance Rds-on of the to-be-tested device 13 may be obtained by obtaining the voltage $V_S$ and the current IRs when the to-be-tested device 13 is turned on. The measuring device 60 does not actively switch the to-be-tested device 13 using a control signal, and may also be referred to as a passive measuring device.

In FIG. 6C, when the transistor 60t1 is turned off, the voltage of the auxiliary power source 60s1 will be superimposed on a measured voltage, leading to low measurement sensitivity of a measuring probe and thus resulting in low precision. The voltage of the auxiliary power supply 60s1 causes a decrease in the measurement accuracy when the GaN HEMT is turned on. The voltage of the auxiliary power supply 60s1 will reduce the measurement accuracy of a small Rds-on when the GaN HEMT is turned on. In addition, the transistor 60t1 is low in natural switching speed in the linear region (when the GaN HEMT is turned off) and the saturation region (when the GaN HEMT is turned on), which easily causes oscillation and affects a measurement result.

Figure 6D:
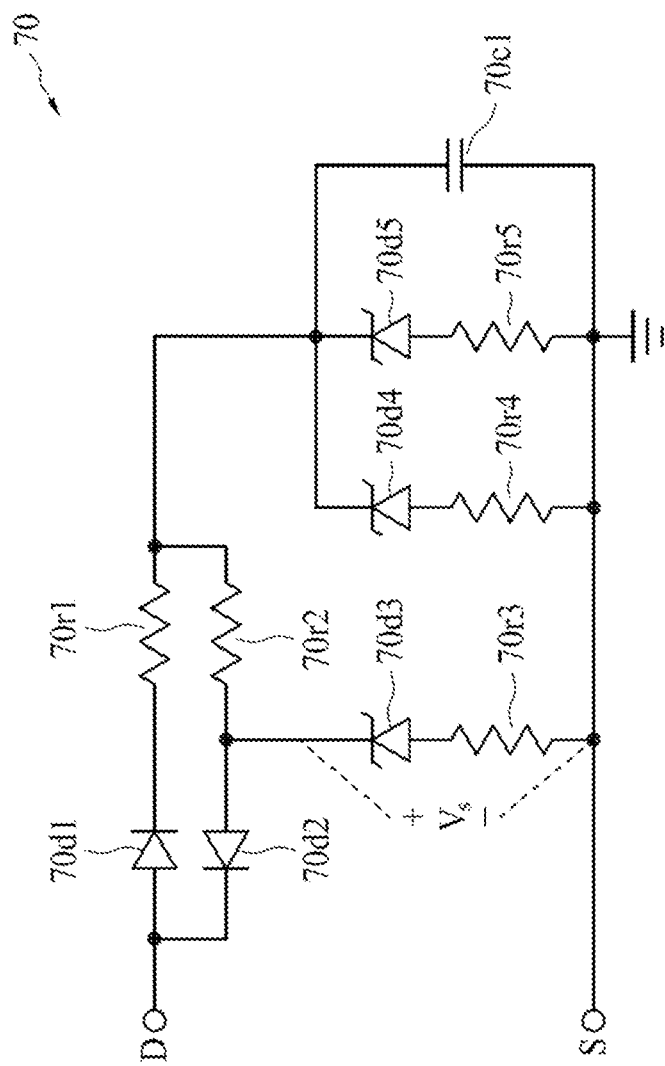

As shown in FIG. 6D, the measuring device 70 includes resistors 70r1, 70r2, 70r3, 70r4 and 70r5. The measuring device 70 further includes diodes 70d1, 70d2, 70d3, 70d4 and 70d5. The measuring device 70 further includes a capacitor 70c1. The to-be-tested device 13 may be connected between a terminal D and a terminal S of the measuring device 70. In some embodiments, the to-be-tested device 13 may be a GaN HEMT.

When the GaN HEMT is turned off, there is a high voltage between the terminal D and the terminal S, and the resistor 70r1 with a large resistance value and the Zener diodes 70d4 and 70d5 block the high voltage together. The voltage $V_S$ is approximately equal to the clamping voltage of the Zener diode 70d3. When the GaN HEMT is turned on, the voltage $V_S$ subtracts the on-voltage drop of the diode 70d2 to obtain the voltage $V_{DS}$.

The dynamic on-resistance Rds-on of the to-be-tested device 13 may be obtained by obtaining the voltage $V_S$ when the to-be-tested device 13 is turned on and an on-voltage drop and current IRs of the diode 70d2.

The measuring device 70 does not actively switch the to-be-tested device 13 using a control signal, and may also be referred to as a passive measuring device.

When the to-be-tested device 13 is a GaN HEMT, since the voltage Vs is relatively high when the GaN HEMT is turned off, an external measuring device (for example, an oscilloscope) needs to be adjusted to a high position to measure the to-be-tested device 13. The external measuring device adjusted to the high position may not accurately measure a small voltage, so the use of the measuring device 70 will result in low measurement accuracy when the GaN HEMT is turned on. In addition, the on-voltage drops of the diodes vary with loads, so a relatively complicated compensation circuit is needed, and thus the measuring device has relatively high cost. In addition, when the device 70 is used to measure the dynamic resistance of the device 13 (GaN HEMT), since the off measured voltage $V_S$ is equal to the voltage of the Zener diode 70d3, and the on measured voltage $V_S$ is equal to the on-voltage of the to-be-tested device 13 (GaN HEMT) and the on-voltage of the diode 70d2, compared with the solutions of FIG. 2 to FIG. 4, the measuring device 70 is different in that the measuring probe is low in sensitivity, so the measurement accuracy is low, and furthermore, the on-voltages of the diodes vary with the loads, so the compensation is complicated.

As used herein, the terms "approximately", "substantially", "basically", and "about" are used to describe and explain small variations. When used in combination with an event or a situation, the terms may refer to an example in which an event or a situation occurs accurately and an example in which the event or situation occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all ranges disclosed herein include endpoints. The term "substantially coplanar" may refer to two surfaces within a few micrometers (μm) positioned along the same plane, for example, within 10 μam, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

As used herein, the terms "approximately", "substantially", "basically", and "about" are used to describe and explain small variations. When used in combination with an event or a situation, the terms may refer to an example in which an event or a situation occurs accurately and an example in which the event or situation occurs approximately. For example, when being used in combination with a value, the term may refer to a variation range of less than or equal to ±10% of the value, for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, if a difference between two values is less than or equal to ±10% of an average value of the value (for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%), it could be considered that the two values are "substantially" the same. For example, being "substantially" parallel may refer to an angular variation range of less than or equal to ±10 with respect to 0, for example, less than or equal to ±5, less than or equal to ±4, less than or equal to ±3, less than or equal to ±2, less than or equal to ±1, less than or equal to ±0.5, less than or equal to ±0.1, or less than or equal to ±0.05. For example, being "substantially" parallel may refer to an angular variation range of less than or equal to ±10 with respect to 0, for example, less than or equal to ±5, less than or equal to ±4, less than or equal to ±3, less than or equal to ±2, less than or equal to ±1, less than or equal to ±0.5, less than or equal to ±0.1, or less than or equal to ±0.05.

For example, two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between any two points on the surface is no greater than 5 μm, no greater than 2 μm, no greater than 1 μm, or no greater than 0.5 μm.

As used herein, the terms "conductive", "electrically conductive", and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is a material having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a", "an", and "the" may include plural referents unless the context clearly dictates otherwise. In the description of some embodiments, assemblies provided "on" or "above" another assembly may encompass a case in which a former assembly is directly on a latter assembly (for example, in physical contact with the latter assembly), and a case in which one or more intermediate assemblies are located between the former assembly and the latter assembly.

As used herein, for ease of description, space-related terms such as "under", "below", "lower portion", "above", "upper portion", "lower portion", "left side", "right side", and the like may be used herein to describe a relationship between one element or feature and another element or feature as shown in the figures. In addition to orientation shown in the figures, space-related terms are intended to encompass different orientations of the device in use or operation. An apparatus may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "substantially", "basically", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all ranges disclosed herein include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent construction does not depart from the spirit and scope of the disclosure, and various variations, replacements, and modifications can be made without departing from the spirit and scope of the disclosure.

What is claimed is:

1. A method for measuring a semiconductor component, performed by a device for measuring the semiconductor component, comprising:
   providing a first signal having a first value at a first time point to turn on the semiconductor component;
   providing a second signal having a second value at a second time point to turn on a switching circuit electrically connected to the semiconductor component;
   providing the second signal having a third value at a third time point to turn off the switching circuit;
   providing the first signal having a fourth value at a fourth time point to turn off the semiconductor component; and
   measuring a first voltage at two ends of the semiconductor component between the second time point and the third time point,
   wherein the second time point is later than the first time point, and the fourth time point is later than the third time point,
   wherein the device for measuring the semiconductor component comprises a protection circuit, and measuring the first voltage at two ends of the semiconductor component comprises at least one of measuring a voltage at two ends of the protection circuit or measuring a voltage between a source and a drain of the semiconductor component.

2. The method according to claim 1, further comprising:
   measuring a first current flowing through the semiconductor component between the second time point and the third time point.

3. The method according to claim 1, wherein the semiconductor component is a gallium nitride (GaN) high electron mobility transistor (HEMT) and has a gate, and the method further comprises providing a first control signal to the gate of the semiconductor component to turn on the semiconductor component.

* * * * *